United States Patent [19]

Deimling et al.

[11] Patent Number: 5,079,505
[45] Date of Patent: Jan. 7, 1992

[54] METHOD IN THE FORM OF A PULSE SEQUENCE FOR FAST CALCULATION OF IMAGES OF THE FAT AND WATER DISTRIBUTION IN AN EXAMINATION SUBJECT ON THE BASIS OF NUCLEAR MAGNETIC RESONANCE

[75] Inventors: Michael Deimling, Moehrendorf-Kleinseebach; Wilfried Loeffler, Erlangen, both of Fed. Rep. of Germany

[73] Assignee: Siemens Aktiengesellschaft, Munich, Fed. Rep. of Germany

[21] Appl. No.: 561,074

[22] Filed: Aug. 1, 1990

[30] Foreign Application Priority Data

Aug. 11, 1989 [EP] European Pat. Off. ........ 89114926.2

[51] Int. Cl.$^5$ ............................................. G01R 33/20
[52] U.S. Cl. ..................................... 324/311; 324/309
[58] Field of Search ............... 324/300, 307, 308, 309, 324/310, 311, 312, 313, 314, 318, 322; 128/653 AF

[56] References Cited

U.S. PATENT DOCUMENTS

| | | | |
|---|---|---|---|
| 4,796,635 | 1/1989 | Dumoulin | 128/653 AF |
| 4,800,889 | 1/1989 | Dumoulin et al. | 128/653 AF |
| 4,825,159 | 4/1989 | Oppelt et al. | 324/309 |
| 4,987,369 | 1/1991 | Van Stapele et al. | 324/307 |
| 5,010,300 | 4/1991 | Paley et al. | 324/309 |
| 5,038,784 | 8/1991 | Dumoulin | 128/653 AF |

OTHER PUBLICATIONS

"Spin Echo Imaging of Multiple Chemical Shifts", Lohman et al., Mag. Res. in Med., vol. 5, No. 1 (1987), pp. 83-86.
"A One-Shot Lactate-Editing Sequence for Localized Whole-Body Spectroscopy", McKinnon et al., Mag. Res. in Med., vol. 8, No. 3 (1988), pp. 355-361.
"A New Steady-State Imaging Sequence for Simultaneous Acquisition of Two NMR Images with Clearly Different Contrasts", Bruder et al., Mag. Res. In Med., vol. 7 (1988), pp. 35-42.
"$^1$H NMR Chemical Shift Selective (CHESS) Imaging", Haase et al., Phys. Med. Biol., vol. 30, No. 4 (1985), pp. 341-344.
"Fast Chemical Shift Imaging: Application on 3D Acquisition", Deimling et al., 6th SMRM Congress, NY, Abstract p. 447.

Primary Examiner—Michael J. Tokar

[57] ABSTRACT

A pulse sequence for operating a magnetic resonance imaging apparatus for fast calculation of images of the fat and water distribution in an examination subject includes the steps of charging the examination subject with a first radio-frequency pulse which is selective with respect to a first spectral component and charging the examination subject with a second radio-frequency pulse which is selective with respect to a second spectral component. A dephasing gradient is activated between the two radio frequency pulses. The spin system is thus phase coded in two directions. A signal with respect to the second spectral component is read out under a first read-out gradient and a signal with respect to the first spectral component is read out under a second read-out gradient. Images of the fat and water distribution in the examination subject can thus be acquired with one measuring sequence.

7 Claims, 2 Drawing Sheets

METHOD IN THE FORM OF A PULSE SEQUENCE FOR FAST CALCULATION OF IMAGES OF THE FAT AND WATER DISTRIBUTION IN AN EXAMINATION SUBJECT ON THE BASIS OF NUCLEAR MAGNETIC RESONANCE

BACKGROUND OF THE INVENTION

1. Field of the Invention

The present invention is directed to a pulse sequence in the form of a method which permits the fast calculation of images of the fat and water distribution in an examination subject on the basis of nuclear magnetic resonance.

2. Description of the Prior Art

A separate calculation of the fat and water distribution of an examination subject is often of significant diagnostic value in nuclear magnetic resonance tomography. It is known to produce separate images for the fat and water distribution to make use of the fact that the water-bonded protons in the spectrum of the magnetic resonance have a chemical shift compared to fat (methylene)-bonded protons.

A method for producing only water and fat images is described in the article $^1$H NMR Chemical Shift Selective (CHESS) Imaging," Haase et al., Phys. Med. Biol., 1985, Vol. 30, No. 4, pp. 341-344. In this known technique, the signal component which is not desired is first excited by a selective 90° RF-pulse. Subsequently, the magnetization is destroyed by a spoiler gradient. The spin system thus remains in a status in which no resultant magnetization of the undesired component is present, whereas the Z-magnetization of the desired component remains uninfluenced. The desired component can then be read out with a standard imaging sequence, i.e., excitation with subsequent locally selective signal evaluation.

A method for the separate production of fat and water images is also described in the article "Fast Chemical Shift Imaging: Application on 3D Acquisition," Deimling et al., 6th SMRM Congress, New York, Abstract p. 447. In this method, a spectrally selective excitation pulse is achieved by means of a square-wave pulse. The frequency spectrum of a square-wave pulse is established by a sine function. The frequency spectrum can then be selected by the duration of the excitation pulse such that it has a maximum for one spectral component (for example, water) and has a minimum for a second spectral component (for example, fat). The fat or lipid spectral component is then not influenced by the square-wave excitation pulse. After a selective excitation with a 90° pulse, the water component is dephased by a spoiler gradient. A three-dimensional data set can be calculated on the basis of a subsequent pulse sequence, this data set then only representing fat components. An image of only the fat distribution can thus be acquired. An image of the water distribution can be correspondingly achieved by shifting the frequency.

The design of spectrally selective RF excitation pulses is known from the article by Hore, appearing in the Journal of Magnetic Resonance, Vol. 54, 539-542 (1983). As described therein, each RF excitation pulse consists of individual pulses having the same spacing. Among other things, RF excitation pulses which are so-called "1331 pulses" are proposed, i.e., four successive individual pulses having the relative lengths of 1,3,3, and 1, with all of the pulses having the same phase. Further, pulse sequence are proposed in the article in which individual pulses have a phase shift of 180°, for example a pulse sequence of 133̄1̄, the bar over the number indicating a 180° phase shift.

The article "A New Steady-State Imaging Sequence for Simultaneous Acquisition of Two MR Images with Clearly Different Contrasts," Bruder et al., Mag. Res. in Med., Vol. 7, pp. 35-42 (1988), discloses a pulse sequence wherein two MR images having noticeably different contrasts are simultaneously supplied. For producing these two images, use is made of the fact that, given a rapid succession of RF pulses, two signals having different $T_2$ contrasts arise between the pulses. A slice of the examination subject is first excited. This is followed by a negative gradient in the x-direction which dephases the nuclear spins in the x-direction, and is followed by a phase-coding gradient in the y-direction. The nuclear spins are then again re-phased by a first, positive gradient in the x-direction, and the resulting signal is read out under the influence of this gradient. A second signal is read out under a second, positive gradient in the x-direction. A second negative gradient in the x-direction and a second phase-coding gradient follow, the latter gradients being designed so that, viewed over the entire sequence, all spins are rephased, so that a steady state condition can be established.

Two completely separate measuring events are always required in the aforementioned methods for the separate production of images of the fat and water distribution of an examination subject. This means that the measuring time is doubled, which does not take into account the preparation time out for each measuring event. Due to movements of the patient between measuring events, however, a correlation between the two measuring events is difficult.

SUMMARY OF THE INVENTION

It is an object of the present invention to provide a pulse sequence wherein images of the distribution of one nucleus type in two different chemical bonds can be acquired in a single measuring sequence.

The above object is achieved in a method, in the form of a pulse sequence, for operating a nuclear magnetic resonance tomography apparatus wherein the examination subject is first charged with a first RF pulse which is selective with respect to a first spectral component of the examination subject. A dephasing gradient is then activated in a first direction, and the examination subject is then charged with a second RF pulse which is selective with respect to a second spectral component of the examination subject. At least one phase coding gradient is then activated in the first direction, or in a second direction, and a dephasing gradient is activated in a third direction. A first readout gradient is then activated in the third direction in a direction opposite to the dephasing gradient, and a first signal with respect to the second spectral component is read out under this first read-out gradient. A second signal with respect to the first spectral component is then read out under a second read-out gradient in the third direction. Gradients for re-phasing the nuclear spins in all spatial directions are then activated.

The above steps are repeated with step-by-step variation of each phase-coding gradient having a repetition time $T_R$ which is shorter than the transverse relaxation time $T_2$ of the nuclear spins under consideration. The two signals are respectively sampled, and the samples are each entered into a respective raw data matrix. Each raw data matrix is subjected to Fourier transformation to obtain separate images of the respective nuclear spin density distributions with respect to the first and second spectral components.

In contrast to known methods, a slice selection in the method disclosed herein by activating a gradient simultaneously with the RF excitation pulse is not possible. Therefore in the method disclosed herein a projection, rather than a tomogram, is produced given the use of only a phase-coding gradient. Preferably, two phase-coding gradients are activated in directions perpendicular to one another, so that a three-dimensional resolution is obtained by interaction with the read-out gradient.

A pulse sequence wherein the first spectral component is that of the water-bonded protons and the second spectral component is that of fat-bonded protons is of particular diagnostic relevance.

The first and second read-out gradients can be combined into a single read-out gradient.

An especially simple pulse sequence for the spectrally selective RF pulses is obtained by constructing the first RF pulse of four individual pulses having the same spacing, and a relative 1,3,3,1 duration, and by constructing the second RF pulse of four individual pulses having identical spacing and the relative durations 1,3,3,1, with the first and third individual pulses in the second RF pulse being phase-shifted by 180° in comparison to the others. The second RF pulse is thus spectrally complementary to the first RF pulse, i.e., it excites exactly those nuclear spins which were not excited by the first RF pulse, and vice versa.

DESCRIPTION OF THE PREFERRED EMBODIMENTS

Figure 1:
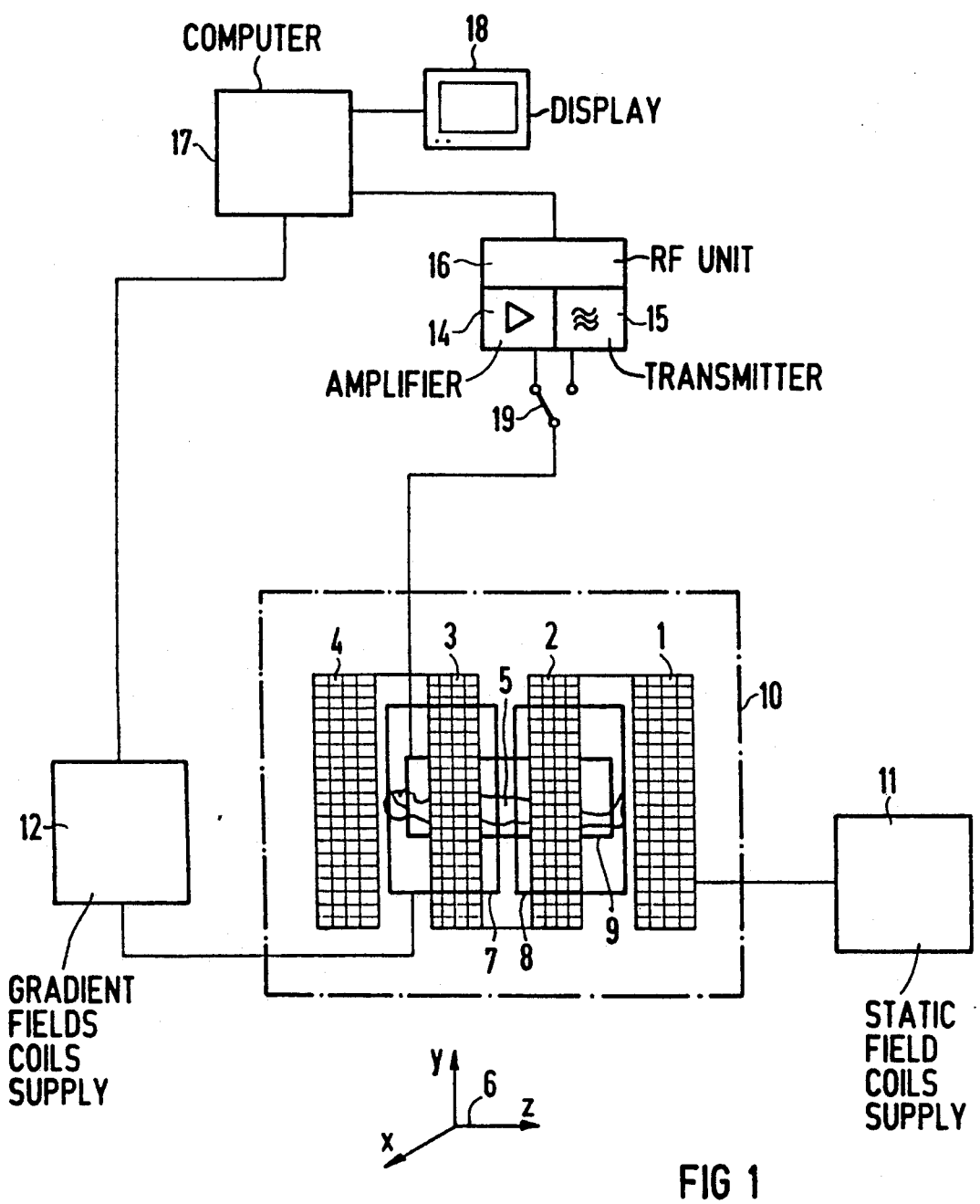
FIG. 1 is a schematic block diagram of a magnetic resonance tomography apparatus of the type suitable for practicing the method disclosed herein.

A known magnetic resonance imaging apparatus of the type suitable for practicing the method disclosed herein is shown in FIG. 1. In this apparatus, coils 1-4 generate a fundamental or static magnetic field in which, for medical diagnostics, the body 5 of a patient to be examined is disposed. Gradient coils are also allocated thereto, for generating independent, orthogonal magnetic field components in the x, y and z, directions, as indicated by the coordinate system 6. For clarity, only gradient coils 7 and 8 are shown in the drawing which, in combination with a pair of identical gradient coils disposed opposite thereto (not shown) produce the x-gradient. Sets of y-gradient coils (not shown) are disposed parallel to the body 5 above and below the body 5, and sets of z-gradient coils (not shown) are disposed transversely to the longitudinal axis of the body 5, at the head and feet thereof.

The apparatus also includes a RF coil which serves to generate and acquire the nuclear magnetic resonance signals. The coils 1,2,3,4,7,8 and 9, bounded by the dot-dash line 10 represent the actual examination instrument.

The examination instrument 10 is operated by electrical components which include a static field coils supply 11 for operating the coils 1-4 and a gradient fields coils supply 12 to which the gradient coils 7 and 8, and the further gradient coils (not shown) are connected. The RF coil 9, depending upon the state of a switch 19, is connected to an amplifier 14 for acquiring nuclear magnetic resonance signals from the body 5 of the patient, or to a transmitter 15 for exciting the nuclear magnetic resonance signals. The amplifier 14 and the transmitter 15 form an RF unit 16, which is connected to a computer 17, which also controls the operation of the gradient fields coils supply 12. The computer 17 constructs an image, or in the case of the present method, a projection, from the acquired signals, which is portrayed on a display 18. A number of different pulse sequences are known for driving the RF unit 16 and the gradient coils. Methods have prevailed wherein the imaging is based on a two-dimensional or three-dimensional Fourier transformation of the acquired measured values.

Figure 2:
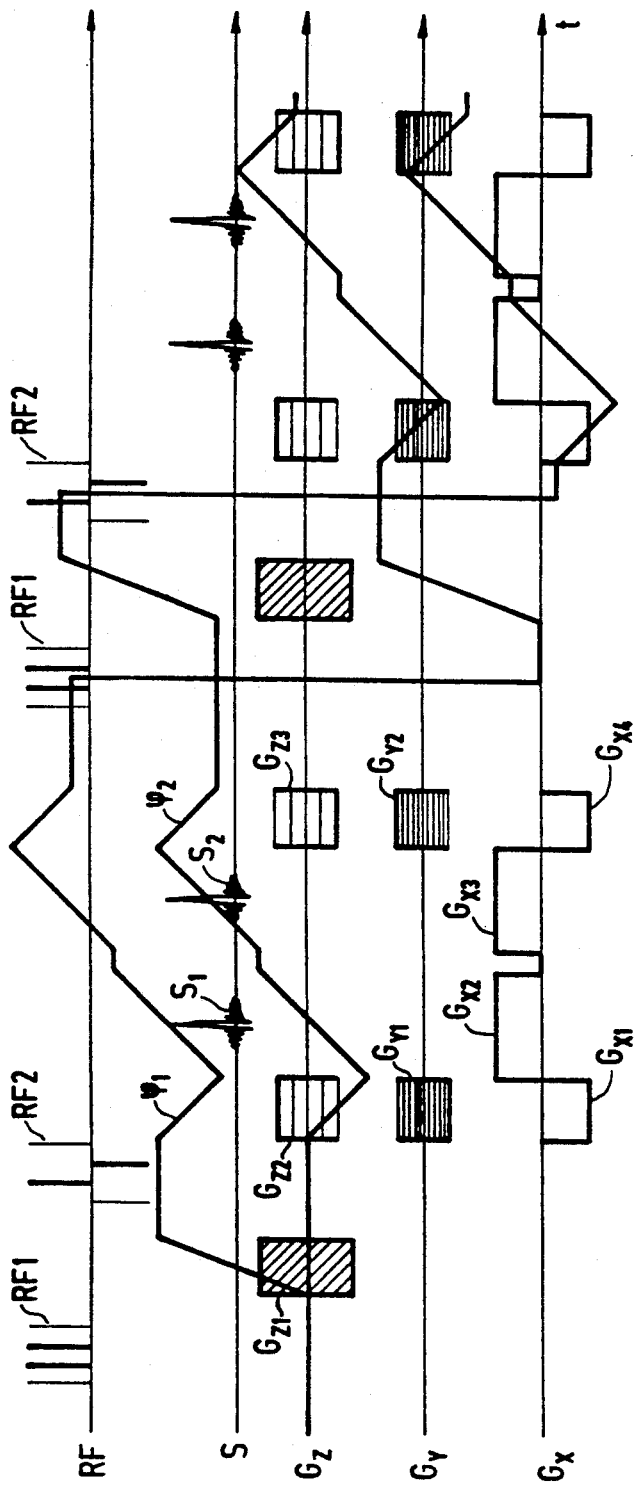
FIG. 2 is a pulse diagram showing the sequence of RF pulses, gradient pulses and the curve of the resulting nuclear magnetic resonance signal in accordance with the principles of the method disclosed herein.
Figure 3:
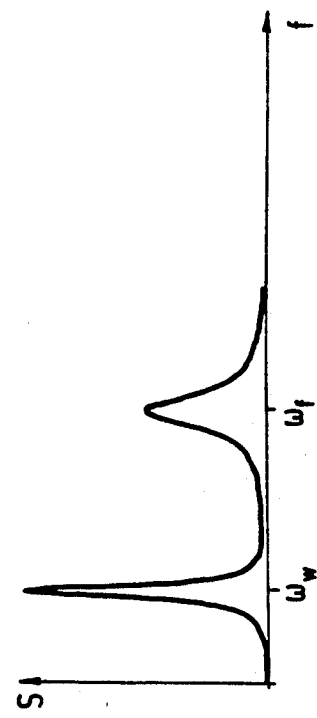
FIG. 3 shows the nuclear magnetic resonance spectrum of the examination subject with separately identifiable spectral components.

An exemplary embodiment of the method in the form of a pulse sequence is shown in FIG. 2. First, a RF pulse RF1 is generated as shown in FIG. 2. This consists of four individual pulses which have identical spacing compared to one another, and which have respective pulse durations in the ratio 1:3:3:1. According to the aforementioned Hore article, such a pulse is frequency selective and is dimensioned so that exactly the resonant line of water-bonded protons is excited. The nuclear magnetic resonance spectrum of the specimen having the resonance line $\omega_w$ for water-bonded protons is shown in FIG. 3.

As also shown in FIG. 2, a dephasing gradient $G_{Z1}$ is generated in z-direction, which destroys the cross-magnetization which occurred after the RF pulse RF1. The phase response of the nuclear spins of the water-bonded protons is shown in FIG. 2 referenced $\phi_1$.

A second RF pulse RF2 is generated after the dephasing gradient $G_{Z1}$. This also consists of four sub-pulses having identical spacing whose duration is defined by the ratio 1:3:3:1. In contrast to the radio-frequency pulse RF1, however, in the pulse RF2 the first and third sub-pulses are phase-shifted by 180° in comparison to the others. The pulse RF2 is thus spectrally complementary to the pulse RF1. The pulse RF2 is dimensioned so that it excites only the fat-bonded protons in the nuclear magnetic resonance spectrum having the resonance line $\omega_f$ shown in FIG. 3.

Due to the absence of a slice selection gradient, the pulses RF1 and RF2 are not selective, so that the entire specimen volume is excited in the region of the coil (antenna) 9.

The second RF pulse RF2 is followed by a phase-coding gradient $G_{Z2}$ in the z-direction and by a phase-coding gradient $G_{Y1}$ in the y-direction, as well as by a dephasing gradient $G_{X1}$ in the negative x-direction. Due to these gradients, both the phase response of the nuclear magnetic resonance signal of the fat-bonded protons (referred to below as the "fat signal") and the phase response of the nuclear magnetic resonance signal of the water-bonded protons (referred to below as the "water signal") are influenced. The phase response of the water signal is referenced $\Phi_2$ in FIG. 2.

Subsequently, a first read-out gradient $G_{X2}$ is activated in the positive x-direction. As can be seen in FIG.

2, the fat signal is thereby re-phased, i.e., a signal S1 arises. This signal is sampled and the samples are entered into a row of a first three-dimensional matrix.

The water signal, having the phase curve $\Phi_1$ as can be seen in FIG. 2, is not yet re-phased at this time, and therefore does not supply a signal contribution.

The first read-out gradient $G_{x2}$ is followed by a second read-out gradient $G_{x3}$ which does not yet result in a signal re-phasing in the first scan. Each scan is concluded by phase-coding gradients $G_{Z3}$ and $G_{y2}$ as well as by a gradient $G_{x4}$ in the negative x-direction. These gradients are designed so that the gradient integral (i.e., the areas under the curves taking into account the positive and negative operational signs) in every direction is zero over every scan, so that a steady state condition can be established. The next scan begins with a further pulse RF1, which selectively excites water-bonded protons and with a pulse RF2 which selectively excites fat-bonded protons, as well as with a dephasing pulse $G_{Z1}$ between the two RF pulses. This is again followed by the gradient pulses described for the first scan, with the phase-coding gradients $G_{Z2}$ and $G_{y1}$ being varied step-by-step from scan to scan.

Due to the RF pulse RF1 in the second scan, the phase of the water signal is inverted. As can be seen from the phase response $\Phi_1$ of the water signal shown in FIG. 2, an echo with respect to the water signal arises in the second scan, and thus in all following scans, as a result of the re-phasing due to the pulse RF1 and the gradient pulse. Due to the immediately preceding RF pulse RF2, and due to the gradients $G_X$, $G_Y$ and $G_Z$ as in the first scan, an echo of the fat signal arises. It should be noted that the phase responses $\Phi_1$ and $\Phi_2$ shown in FIG. 4 refer only to the first excitation with the pulses RF1 and RF2. Each further excitation in each following scan will result in corresponding phase curves of the excited nuclear spins, however, these further curves are not shown in the interest of clarity.

The fat signal S1 is based essentially on the immediately preceding excitation with the RF pulse RF2 in the same scan; the water signal S2 is essentially based on the excitation by an RF pulse in the preceding scan, because the excitation implemented in the same scan is dephased by the dephasing pulse $G_{Z1}$. Although preceding scans influence the signals S1 and S2, this occurs only in attenuated fashion because of the relaxation of the excited nuclear spins.

By appropriate adjustment of the gradient pulses, the two signals S1 and S2, respectively allocated to the water-bonded and fat-bonded protons, can be successively acquired.

The two signals S1 and S2 are respectively entered into separate matrices, with enough scans with varied phase-coding gradients $G_Y$ and $G_Z$ being undertaken so that sufficient measured values for a three-dimensional matrix are collected. Respective images of the fat and water distribution can then be acquired by three-dimensional Fourier transformation of the two matrices.

A fast acquisition of two images of the distribution of different chemical substances is thus possible with the described method (pulse sequence). The separation of the two proton spin systems enables the employment of a suitable flip angle for each of the two components. Bandwidth-optimized sequences, without artifacts due to chemical shifting, can be employed.

As a result of the lack of a spatial selectivity, the entire examination volume must be excited, because over-convolution effects will otherwise appear. This can be resolved, however, by employing surface coils having a limited sensitivity range.

Although modifications and changes may be suggested by those skilled in the art, it is the intention of the inventors to embody within the patent warranted hereon all changes and modifications as reasonably and properly come within the scope of their contribution to the art.

We claim as our invention:

1. A pulse sequence for operating a nuclear magnetic resonance tomography apparatus comprising the steps of:
    charging an examination subject with a first RF pulse which is selective with respect to a first spectral component of a spectrum of the examination subject;
    activating a dephasing gradient in a first direction;
    charging said examination subject with a second RF pulse which is selective with respect to a second spectral component of said spectrum of said examination subject;
    generating at least one phase-coding gradient in at least a first or a second direction, and generating a dephasing gradient in a third direction;
    generating a first read-out gradient in said third direction in a direction opposite to the dephasing gradient and reading out a first signal with respect to said second spectral component under said first read-out gradient;
    generating a second read-out gradient in said third direction and reading out a second signal with respect to said first spectral component under said second read-out gradient;
    generating gradients for re-phasing nuclear spins in all of said first, second and third directions;
    repeating the above steps a selected number of times with a step-by-step variation of each phase-coding gradient having a repetition time which is shorter than the transverse relaxation time of the nuclear spins and obtaining a sample of each of said first and second signals for each repetition;
    entering said samples of said first and second signals respectively into first and second matrices; and
    conducting a Fourier transformation of the data contained in each of said first and second matrices to obtain respective projections of the nuclear spin density distributions of said first and second spectral components.

2. A method as claimed in claim 1 wherein the step of generating at least one phase-coding gradient is further defined by generating two phase-coding gradients simultaneously in directions perpendicular to each other.

3. A method as claimed in claim 1 wherein said first spectral component is that of water-bonded protons and said second spectral component is that of fat-bonded protons.

4. A method as claimed in claim 1 wherein the steps of generating a first read-out gradient and generating a second read-out gradient are combined to form a step of generating a single read-out gradient.

5. A method as claimed in claim 1 wherein the step of generating a first RF pulse is further defined by generating a first RF pulse consisting of four individual pulses having identical spacing and relative pulse durations in the ratio 1:3:3:1.

6. A method as claimed in claim 5 wherein the step of generating a second RF pulse is further defined by generating four individual pulses having identical spacing and relative pulse durations of 1:3:3:1, with a first and third individual pulse being phase-shifted by 180° relative to the other individual pulses.

7. A method as claimed in claim 1 comprising the additional step of generating said first and second RF pulses and acquiring said first and second signals via a surface coil.

* * * * *